(12) United States Patent
Boguslavskiy et al.

(10) Patent No.: US 7,235,139 B2
(45) Date of Patent: Jun. 26, 2007

(54) WAFER CARRIER FOR GROWING GAN WAFERS

(75) Inventors: Vadim Boguslavskiy, Princeton, NJ (US); Alex Gurary, Bridgewater, NJ (US); Richard A. Stall, Belle Mead, NJ (US)

(73) Assignee: Veeco Instruments Inc., Woodbury, NY (US)

( * ) Notice: Subject to any disclaimer, the term of this patent is extended or adjusted under 35 U.S.C. 154(b) by 123 days.

(21) Appl. No.: 10/975,902

(22) Filed: Oct. 28, 2004

(65) Prior Publication Data
US 2005/0126496 A1 Jun. 16, 2005

Related U.S. Application Data

(60) Provisional application No. 60/514,959, filed on Oct. 28, 2003.

(51) Int. Cl.
*C23C 16/00* (2006.01)
(52) U.S. Cl. .................. 118/728; 118/724; 118/500
(58) Field of Classification Search ................ 118/728, 118/500; 156/345.23, 345.51; 269/21; 206/832; 414/416.01
See application file for complete search history.

(56) References Cited

U.S. PATENT DOCUMENTS

| | | | |
|---|---|---|---|
| 3,549,847 A | 12/1970 | Clark | |
| 3,633,537 A | 1/1972 | Howe | |
| 3,845,738 A | 11/1974 | Berkman et al. | |
| 4,100,879 A | 7/1978 | Goldin et al. | |
| 4,877,573 A * | 10/1989 | Nilsson | 117/108 |
| 4,906,011 A | 3/1990 | Hiyamizu et al. | |
| 4,981,345 A * | 1/1991 | Berry et al. | 359/391 |

(Continued)

FOREIGN PATENT DOCUMENTS

| | | | |
|---|---|---|---|
| JP | 55143036 A | 11/1980 |
| JP | 62053774 A | 3/1987 |
| JP | 03184327 A | 8/1991 |
| JP | 05259051 A | 10/1993 |

OTHER PUBLICATIONS

REMBAR Rhenium Technical Info. Taken from www.rembar.com/Rhenium.htm.*

Basics of Design Engineering: Refractory Metals. Taken from www.machinedesign.com.*

*Primary Examiner*—Parviz Hassanzdeh
*Assistant Examiner*—Sylvia R. MacArthur
(74) *Attorney, Agent, or Firm*—Lerner, David, Littenberg, Krumholz & Mentlik, LLP

(57) ABSTRACT

A wafer carrier for growing wafers includes a plate having a first surface and a second surface, a plurality of openings extending from the first surface to the second surface of the plate, and a porous element disposed in each of the plurality of openings, each porous element being adapted to support one or more wafers. The wafer carrier also has a blind central opening extending from the second surface toward the first surface of the plate, and a plurality of shafts extending outwardly from the blind central opening. Each shaft has a first end in communication with the blind central opening and a second end in communication with one of the porous elements for providing fluid communication between the blind central opening and one of the porous elements. Suction is formed at a surface of each porous element by drawing vacuum through the blind central opening and the shafts.

23 Claims, 5 Drawing Sheets

U.S. PATENT DOCUMENTS

| | | |
|---|---|---|
| 5,002,011 A | 3/1991 | Ohmine et al. |
| 5,148,714 A | 9/1992 | McDiarmid |
| 5,323,701 A * | 6/1994 | Sommer .................... 101/126 |
| 5,336,324 A | 8/1994 | Stall et al. |
| 5,370,739 A | 12/1994 | Foster et al. |
| 5,421,595 A | 6/1995 | Cripe et al. |
| 5,529,626 A | 6/1996 | Stewart |
| 5,534,073 A * | 7/1996 | Kinoshita et al. ........... 118/728 |
| 5,562,947 A | 10/1996 | White et al. |
| 5,575,856 A | 11/1996 | Foster et al. |
| 5,676,758 A | 10/1997 | Hasegawa et al. |
| 5,759,281 A | 6/1998 | Gurary et al. |
| 5,788,777 A | 8/1998 | Burk, Jr. |
| 5,835,677 A | 11/1998 | Li et al. |
| 5,840,124 A | 11/1998 | Gurary et al. |
| 5,976,260 A | 11/1999 | Kinoshita et al. |
| 6,001,183 A | 12/1999 | Gurary et al. |
| 6,032,715 A | 3/2000 | Ohkubo et al. |
| 6,080,241 A | 6/2000 | Li et al. |
| 6,112,735 A | 9/2000 | Farnworth |
| 6,149,727 A | 11/2000 | Yoshioka et al. |
| 6,382,609 B1 * | 5/2002 | Namioka et al. ............. 269/21 |
| 6,444,027 B1 * | 9/2002 | Yang et al. ................. 117/200 |
| 6,464,795 B1 | 10/2002 | Sherstinsky et al. |
| 6,517,420 B2 * | 2/2003 | Ishikawa et al. .............. 451/67 |
| 6,606,234 B1 * | 8/2003 | Divakar ..................... 361/234 |
| 2004/0091342 A1 * | 5/2004 | Yajima et al. ......... 414/416.01 |

\* cited by examiner

WAFER CARRIER FOR GROWING GAN WAFERS

CROSS REFERENCE TO RELATED APPLICATIONS

This application claims the benefit of the filing date of U.S. Provisional Patent Application No. 60/514,959 filed Oct. 28, 2003, the disclosure of which is hereby incorporated herein by reference.

BACKGROUND OF THE INVENTION

The present invention relates to making semiconductor materials and devices and more particularly relates to an apparatus for growing epitaxial layers for materials such as GaN.

Semiconductor wafers are frequently manufactured by placing wafers (also known as substrates) within a reaction chamber of a chemical vapor deposition (CVD) reactor and then growing one or more epitaxial layers on the wafers. During this process, wafers are placed inside the CVD reactor and reactant chemicals in gaseous form are introduced over the wafers in controlled quantities and at controlled rates for growing epitaxial layers on the wafers.

CVD reactors have various designs, including horizontal reactors in which wafers are mounted at an angle to the inflowing reactant gases; horizontal reactors with planetary rotation in which the reactant gases pass across the wafers; barrel reactors; and vertical reactors in which wafers are rotated at a relatively high speed within the reaction chamber as reactant gases are injected downwardly onto the wafers.

The reactant chemicals, commonly referred to as precursors, are typically introduced into the reaction chamber by placing the reactant chemicals in a device known as a bubbler and then passing a carrier gas through the bubbler. The carrier gas picks up molecules of the reactant chemicals to provide a reactant gas which is then fed into the reaction chamber of the CVD reactor using a mass flow controller.

The conditions under which the reactant gases are introduced into the reaction chamber have a dramatic effect upon the characteristics of the epitaxial layers grown on the wafers. These conditions, which may be modified to optimize the nature of the epitaxial layers grown on the wafers, typically include, density, vapor pressure, the flow path of the reactant gases, chemical activity and temperature. For example, the flow path of the reactant gases may be altered by changing the design of the flow flange used to introduce reactant gases into reaction chambers. In many instances, the properties of the epitaxial layers grown on the substrates are studied to determine the optimum flow path for growing a particular type of layer.

When depositing epitaxial layers on wafers, the wafers are typically placed on a wafer carrier within a reaction chamber, which, in turn, may be placed upon a rotatable susceptor. In certain designs developed by Emcore Corporation of Somerset, N.J., the susceptor and in turn the wafer carrier are heated by a source of heat located underneath the susceptor, such as resistive filaments or lamps. In these reactors, the growth of uniform epitaxial layers is attained by rapidly rotating the wafer carrier and susceptor on which the wafers are mounted. The thickness, composition and quality of the deposited layers determine the characteristics of the resulting semiconductor devices. Accordingly, the deposition process must be capable of depositing films of uniform composition and thickness on the front face of each wafer. The requirements for uniformity have become progressively more stringent with the use of larger wafers and with the use of apparatus which deposit coatings on several wafers simultaneously.

In deposition processes using conventional wafer carriers, the surface temperature of the wafers is usually cooler than the surface temperature of the wafer carrier as a result of the thermal resistance created by the susceptor, the interface between the wafers and the wafer carrier and the different emissivities of the materials from which the susceptor, wafer carrier and the wafer are made. Unfortunately, this temperature difference diminishes the quality of the resultant semiconductor wafers. For example, the higher temperature of the wafer carrier surface results in a nonuniform temperature on the surface of the wafers, particularly along their outer periphery, such that the layer(s) deposited along peripheral portions of wafers ordinarily are of inferior quality and limited value. Moreover, arrangements using a susceptor require too much filament power to heat the susceptor which then heats the wafer carrier.

In the typical prior art device shown in FIG. 1A, a wafer 10 is mounted atop a wafer carrier 12. In turn, the wafer carrier 12 is mounted on a susceptor 14 that is attached atop a rotatable support spindle 16. The wafer(s) 10, wafer carrier 12, and the upper end of susceptor 14 are generally located within an enclosed reactor chamber. A heating assembly 18 may be arranged below susceptor 14 for heating the susceptor, the wafer carrier 12 and wafer(s) 10 mounted thereon. Spindle 16 preferably rotates so as to enhance the uniformity of reactant gases flowing over the wafers 10. Rotating spindle 16 generally enhances the uniformity of reactant gases flowing over wafers 10 as well as temperature uniformity across the wafers 10.

Wafer carrier 12 includes circular-shaped pockets 20 on their upper surfaces 22 for holding wafers 10 in place as wafer carrier 12 is rotated during the deposition process. Typically, the circular pockets 20 have a diameter that is about 0.020" larger than the diameter of the wafer(s) 10 and a depth that is about 0.002" deeper than the thickness of the wafers. These wafer carriers 12 also typically include an annular flange 24 which is used for lifting and transporting wafer carrier 12 into and out of the reaction chamber. On its bottom surface, wafer carrier 12 may include an annular wall 26 for locating and holding wafer carrier 12 on susceptor 14 as the wafer carrier is rotated during the deposition process.

Referring to FIG. 1B, during the deposition process, wafers 10 are heated by heating assembly 18. As a result, earlier deposited epitaxial layers generally have a higher temperature than later deposited epitaxial layers. This frequently results in the peripheral edges 28 of each wafer 10 warping (i.e., curling up and away) from wafer carrier 12, as shown in FIG. 1B. As a result, the peripheral edges 28 of wafer(s) 10 are no longer in contact with wafer carrier 12 and are no longer being heated to the same level as interior portions of the wafer. Although the present invention is not limited by any particular theory of operation, it is believed that the warping is due to the bottom of the wafers being at a higher temperature than the top of the wafers or as a result of other stresses placed on the wafers during growth. Moreover, there is uneven heating of the wafers because the interior portions of the wafers are being heated when the curled outer portions of the wafers are further away from the heating assembly as a result of this wafer warpage. As a result, the epitaxial layers are not uniform across the wafers and the outer portions of the warped wafers 10 must be discarded. This is because, inter alia, semiconductor devices taken from the outer portions of the warped wafer will have different operating characteristics than semiconductor devices taken from interior regions of the wafers.

Another problem with the arrangement shown in FIGS. 1A and 1B is that the susceptor 14 prevents efficient heating of the wafer carrier 12. This situation is problematic when relatively high temperatures must be attained, such as when growing GaN wafers. At high temperatures, the heating filament may melt or deform.

Thus, there is a need for an apparatus that may be used to deposit more uniform epitaxial layers atop the entire surface of each wafer. More particularly, there exists the need for a wafer carrier that will maintain the wafers substantially flat during the epitaxial layer forming process, thereby preventing the edges of the wafers from curling.

There is also a need for an arrangement wherein the heating element directly heats the wafer carrier, without a susceptor or other object being located between the heating element and the wafer carrier. Such an arrangement enables the temperature of the heating filament to be maintained at a lower level, while still heating the wafer carrier to sufficient levels.

SUMMARY OF THE INVENTION

The present invention discloses an apparatus for growing epitaxial layers on wafers and is more preferably related to an apparatus for growing GaN wafers. The present application incorporates one or more of the concepts disclosed in U.S. patent application Ser. No. 09/619,254 filed Jul. 19, 2000, the disclosure of which is hereby incorporated by reference herein.

The present invention seeks to overcome the problems that occur with certain prior art apparatus. Specifically, in prior art apparatus, a susceptor is used to support the wafer carrier. The susceptor is typically positioned between the wafer carrier and heating filaments used to heat the wafer carrier. According to those skilled in the art, the susceptor captures heat from the heating filament which requires the heating filament to be heated to a higher temperature to produce the same wafer temperature. This is due to the susceptor drawing some of the heat and preventing direct heat transfer from the heating filament to the wafer carrier. The present invention overcomes this problem by eliminating the need for the susceptor through the use of a specially designed wafer carrier directly coupled with an upper end of a spindle.

The wafer carrier includes a plate having a top surface and a bottom surface, a central opening with a plurality of hollow, radially extending shafts extending from the central opening to the outer perimeter of the plate. In certain preferred embodiments, the central opening is created using a milling machine. The hollow, radially extending shafts may be formed using a drill, whereby each shaft is drilled from the outer perimeter of the plate to the central opening.

The wafer carrier also includes a series of openings milled completely through the plate for receiving wafer carrying discs. Each such opening is specially designed to support a substantially porous disc. The porous discs are held in the wafer carrier openings by retaining rings that are secured to the plate using securing elements such as screws to hold the retaining rings to the plate.

The central opening preferably has a separate piece inserted therein. The separate piece includes a central hub made of a material that will not diffuse into the spindle material and thus not bind to the spindle. For example, the central hub may be made of graphite or other ceramic material that will not diffuse into a spindle made of molybdenum.

In operation, the wafer carrier is secured to an upper end of a spindle by aligning the central opening with the top of the spindle. Before or after placing the wafer carrier inside a reaction chamber, wafers are positioned over the porous discs of the wafer carrier. Vacuum may then be drawn through the spindle, which, in turn, is drawn through the central opening of the wafer carrier and the hollow radially extending shafts in communication with the central opening. The vacuum is then drawn through the porous discs for preventing the edges of the wafer substrate from warping during an epitaxial layer growth process. As noted above, the apparatus does not have an object such as a susceptor between the wafer carrier and the heating filament. As a result, the wafer carrier is directly heated by the heating filament and excess heat is not wasted heating an extra object such as a susceptor. Thus, when growing GaN wafers, the heating filament must only be heated to approximately 1,900–2,000° C. to obtain a preferred temperature of 1,150° C. at the top surface of the wafer carrier. In contrast, if an object such as a susceptor were present between the wafer carrier and the heating filament, studies show that the heating filament must be heated to approximately 2,500–2,600° C. to obtain the necessary 1,150° C. at the top surface of the wafer carrier. At these relatively high temperatures (i.e. 2,500–2,600° C.), the heating filament will typically melt and/or deform.

Thus, the present application solves at least two problems when growing epitaxial layers. One problem solved, which was addressed in above-mentioned U.S. application Ser. No. 09/619,254 filed Jul. 19, 2000, the disclosure of which is hereby incorporated by reference herein, is that the vacuum drawn through the porous discs prevents the edges of the wafers from warping. The other problem solved is that the specially designed wafer carrier may be used in an apparatus having no object between the wafer carrier and the heating filament for better heat transfer between the heating filament and the wafer carrier. As a result, the heating filament does not have to be heated to extremely high temperatures (e.g. 2,500–2,600° C.). This is particularly beneficial for growing GaN wafers which must be grown at particularly high temperatures.

Each substantially porous disc is preferably made of a material selected from the group consisting of graphite, SiC and molybdenum and preferably has a porosity of approximately of 7–14%.

The deposition chamber may also include a pump in communication with a spindle opening that generates a vacuum or suction within an elongated opening extending through the spindle. Upon generating the area of low pressure within the spindle opening, a vacuum or low-pressure area of equal force is generated within both the central opening and the hollow shafts of the wafer carrier. When wafers are positioned atop the porous discs of the wafer carrier and one or more reactant gases are introduced into the reaction chamber, the vacuum or suction within the central opening of the wafer carrier is less than the pressure level within the reaction chamber. As a result, suction develops at an interface between the wafer and the porous discs. Such suction prevents the peripheral edges of the wafers from warping or pulling away from the wafer carrier as the epitaxial layers are deposited, as occurs in prior art deposition chambers (e.g., the prior art embodiment shown in FIG. 1A). As a result, uniform epitaxial layers are formed across the entire surface of the wafer, thereby providing reliable semiconductor devices that may be harvested from the peripheral regions of the wafers.

These and other preferred embodiments of the present invention will be described in more detail below.

In certain preferred embodiments, the porous element is about 7–14% porous. The wafer carrier may be made of a material capable of withstanding the heat within a reaction chamber such as molybdenum, tungsten, tantalum and rhenium. The plate may be made of molybdenum, tungsten, tantalum and rhenium. The porous element may be made of materials capable of withstanding the heat inside a reaction chamber such as silicon carbide and graphite.

The blind opening in the plate is desirably centrally located on the plate and the at least one shaft extends outwardly from the blind opening. In certain preferred embodiments, the at least one shaft is airtight. The shaft preferably extends radially outwardly from the blind opening. The at least one shaft is preferably adapted for drawing vacuum therethrough for creating suction at a surface of the porous element.

In certain preferred embodiments, the blind opening of the plate has a hub disposed therein. The hub preferably couples with an upper end of a spindle. The hub is preferably made of a non-diffusible material such as graphite.

In other preferred embodiments of the present invention, a wafer carrier for growing wafers includes a plate having a first surface and a second surface, a plurality of openings extending from the first surface to the second surface of the plate, and a porous element disposed in each of the plurality of openings, whereby each porous element is adapted to support one or more wafers. The wafer carrier also desirably includes a blind central opening extending from the second surface toward the first surface of the plate, and a plurality of shafts extending outwardly from the blind central opening, each shaft having a first end in communication with the blind central opening and a second end in communication with one of the porous elements for providing fluid communication between the blind central opening and one of the porous elements. One or more of the shafts may extend around the perimeter of one or more of the porous elements. In operation, suction is preferably formed at a surface of each porous element by drawing vacuum through the blind central opening and the shafts.

In certain preferred embodiments, the openings have a first diameter at the first surface of the plate and a second diameter at the second surface of the plate, whereby the first diameter is larger than the second diameter. The wafer carrier also preferably includes retaining rings insertible into the first diameter openings in the plate for retaining the porous elements in place. The retaining rings are desirably made of materials that are capable of withstanding the heat present within a reaction chamber such as molybdenum and tungsten.

In another preferred embodiment of the present invention, an apparatus for growing epitaxial layers on wafers includes a rotatable spindle having an upper end disposed inside a reaction chamber and an opening extending between the upper end and a lower end of the spindle. The apparatus preferably includes a rotatable wafer carrier secured to the upper end of the spindle. The rotatable wafer carrier preferably includes a plate having a first surface and a second surface, at least one opening extending from the first surface to the second surface of the plate, a porous element disposed in the at least one opening in the plate, whereby the porous element is adapted to support one or more wafers, and a blind opening extending from the second surface toward the first surface of the plate, the blind opening being in communication with the opening extending between the upper and lower ends of the spindle. The apparatus also preferably includes at least one shaft extending between the blind opening and the porous element for providing fluid communication between the blind opening and the porous element. In operation, drawing vacuum through the opening of the spindle, the blind opening and the at least one shaft forms suction at a surface of the porous element.

The apparatus also preferably includes a heating element opposing the second surface of the plate so that the porous element is directly exposed to the heating element for unobstructed, direct heating of the porous element by the heating element. The lower end of the spindle is desirably connected to a vacuum pump so that the pressure level at a surface of the porous element is less than the pressure level within the reaction chamber.

DETAILED DESCRIPTION

Figure 2:
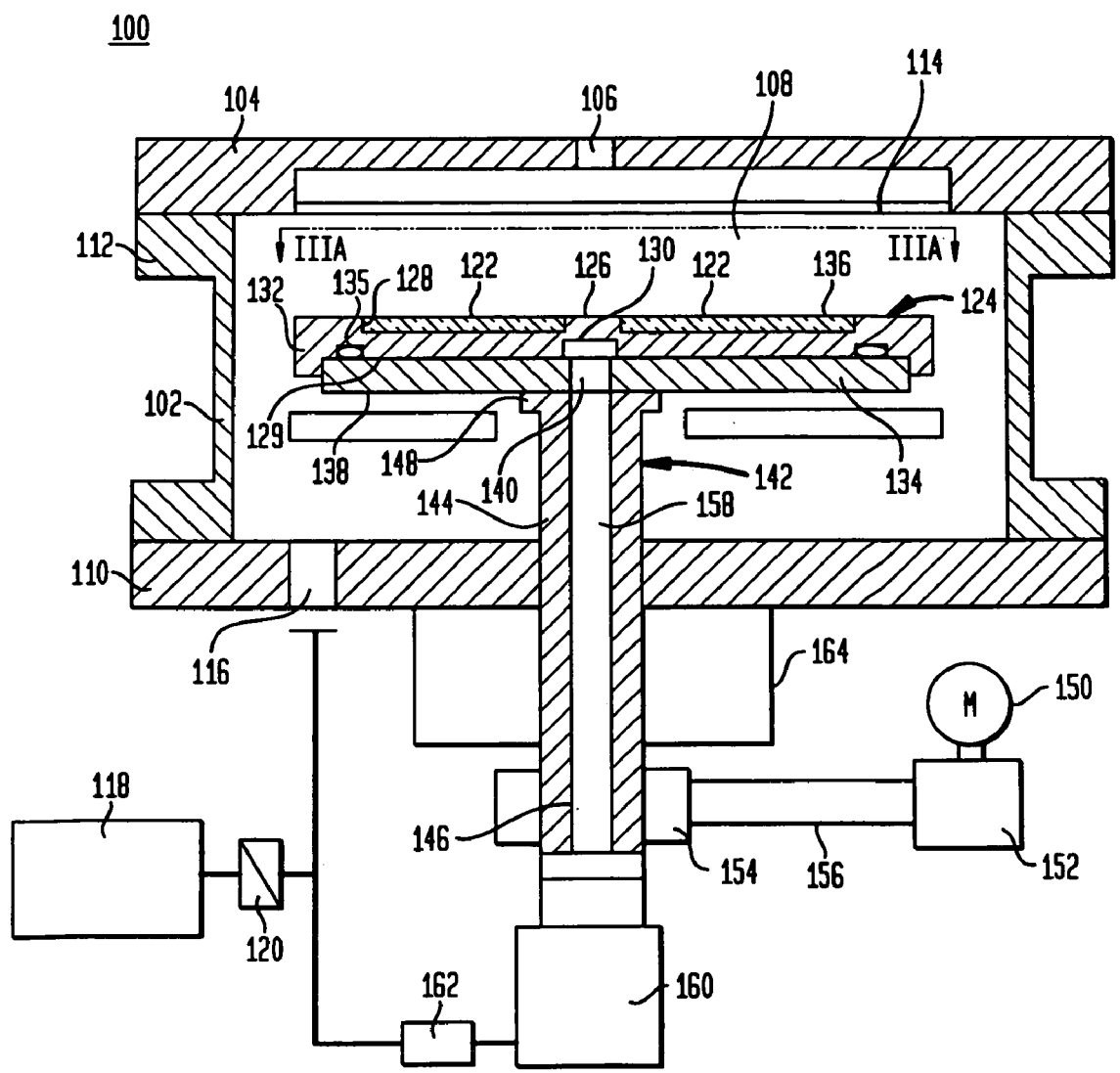
FIG. 2 shows a cross-sectional view of a deposition chamber including a wafer carrier, a rotatable susceptor and a rotatable spindle.

FIG. 2 shows an apparatus for growing epitaxial layers on wafers. The apparatus includes a deposition chamber 100 comprising a side wall 102, and a top flange 104 including one or more openings 106 for introducing reactant chemicals, such as reactant gases, into an interior region 108 of deposition chamber 100. Deposition chamber 100 also includes a bottom-sealing flange 110. The deposition chamber 100 is made of stainless steel with the top and bottom flanges 104 and 110 being sealingly engaged with sidewall 102. The reactant gases introduced through the opening 106 in top flange 104 are generally uniformly distributed by one or more showerheads 114. The reactant gases interact with one another inside deposition chamber 100 to form epitaxial layers upon wafers. After the reactant gases interact with one another and are deposited atop wafers, the waste material is removed through an exhaust 116 extending through bottom-sealing flange 110. In certain embodiments, the waste reactant gases are removed through exhaust opening 116 using pump 118. The pressure level within the interior region 108 of deposition chamber 100 is regulated by throttle valve 120.

When growing epitaxial layers on wafers, the wafers 122 are positioned within deposition chamber 100 and atop wafer carrier 124. Each wafer carrier 124 has a top surface 126, a bottom surface 129, and one or more wafer-receiving cavities 128 adapted to receive one or more wafers 122 therein. Each wafer-receiving cavity 128 has a diameter that is greater than or equal to the outer diameter of the wafer 122 stored therein. Wafer carrier 124 also includes a hollow space 130 formed in the bottom surface 129 of wafer carrier 124. The hollow space 130 may be centrally located on the wafer carrier 124. The wafer carrier 124 is made of a substantially porous material such as graphite, SiC, molybdenum or other well-known materials typically used for wafer carriers. The porosity of wafer carrier 124 is preferably between about 7–14%.

The wafer carrier 124 includes outer flanges 132 that define the outer perimeter of wafer carrier 124. Wafer carrier 124 is adapted to be positioned atop a rotatable susceptor 134 having a top surface 136 and a bottom surface 138 remote therefrom. Susceptor 134 also includes a central opening 140 extending between top and bottom surfaces 136, 138.

Susceptor 134 is connected to a rotatable spindle 142 having an upper end 144 disposed inside deposition chamber 100 and a lower end 146 located outside the deposition chamber. The uppermost end of spindle 142 desirably includes a flanged portion 148 mounted to the bottom surface 138 of susceptor 134. Spindle 142 may be rotated by a motor 150 through pulleys 152, 154 and belt 156. The spindle 142 has an elongated opening 158 extending therethrough that is aligned with the central opening 140 extending through susceptor 134. When the wafer carrier 124 is provided atop susceptor 134, the hollow space 130 at the bottom surface 129 thereof is preferably in substantial alignment with spindle opening 158 and susceptor opening 140. The outer flanges 132 hold wafer carrier 124 atop susceptor 134 as wafer carrier 124 and susceptor 134 rotate.

The lowermost end of spindle 142 is preferably connected to pump 118 for drawing a vacuum through spindle opening 158. Differential pressure controller 162 regulates the pressure within the interior region 108 of deposition chamber 100 and the pressure level within spindle opening 158, susceptor opening 140 and hollow space 130, so that the pressure level within hollow space 130 is always less than the pressure level within the interior region 108 of deposition chamber 100. A vacuum seal is provided between deposition chamber 100 and spindle 142, or around spindle 142, such as by using one or more vacuum rotating feedthroughs 160 and 164. Well known vacuum rotating feedthroughs are manufactured by Ferrofluidic Corporation, Advanced Fluid Systems and Rigaku.

Figure 1A:
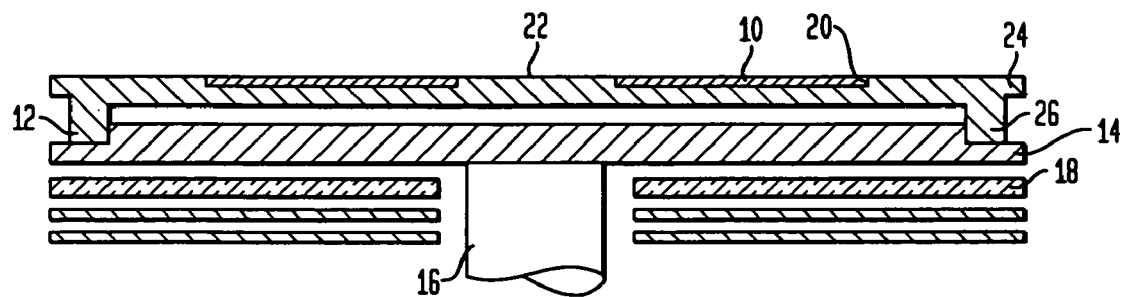
FIG. 1A is a cross-sectional view of a prior art wafer carrier including wafers mounted atop the wafer carrier, a susceptor, a rotatable spindle used to support the susceptor, and a heating device for heating the susceptor.
Figure 1B:
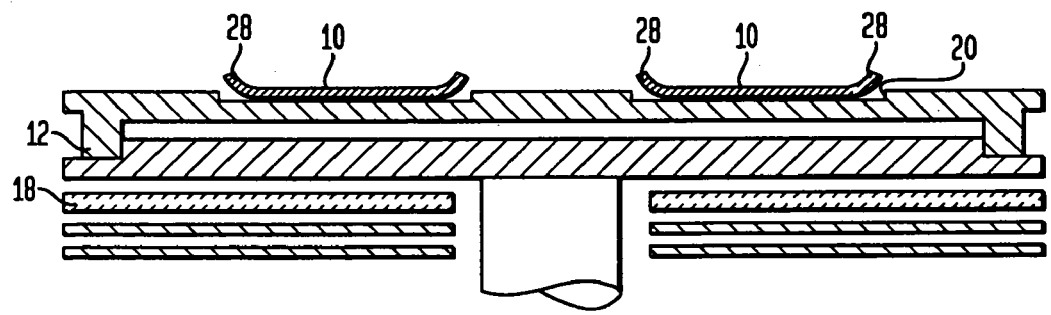
FIG. 1B shows the prior art wafer carrier of FIG. 1A with epitaxial layers being grown atop the wafers.

As mentioned above, the wafer carrier 124 includes a hollow space 130 formed at the bottom surface 129 of wafer carrier 124. As pump 118 is activated, a vacuum is created within spindle opening 158, susceptor opening 140 and hollow space 130. The wafer carrier includes one or more channels 135 in communication with hollow space 130 so that the low pressure or vacuum within hollow space 130 may pass throughout the entire area of the substantially porous wafer carrier. As a result, the pressure level at the interface of the wafers 122 and the wafer carrier (i.e., within the cavities 128) is less than the pressure level within the interior region 108 of reaction chamber 100. As used herein, the terminology "interface of the wafers 122 and wafer carrier" means the areas of the wafer carrier in direct contact with the wafers placed on the carrier. The low pressure at the interface suctions the wafers 122 to cavities 128, thereby preventing the peripheral edges of the wafers 122 from warping, as occurs with the prior art device shown in FIG. 1B. It is believed that maintaining the wafers 122 substantially flat during deposition of reactant gases thereupon (i.e., preventing warping of the edges) will result in the formation of semiconductor wafers having uniform epitaxial layers across the entire area of the wafers. As a result, the semiconductor devices formed at the edges of the wafer may be used, and not discarded as occurs with prior art processes.

Figure 3:
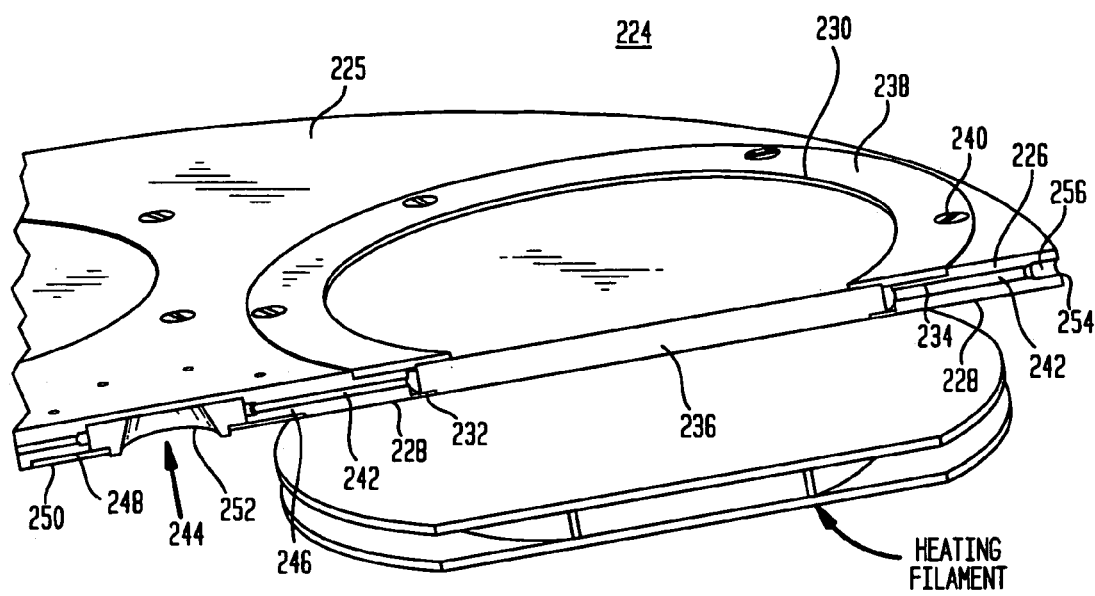
FIG. 3 shows a cross-sectional view of a wafer carrier, in accordance with certain preferred embodiments of the present invention.
Figure 4:
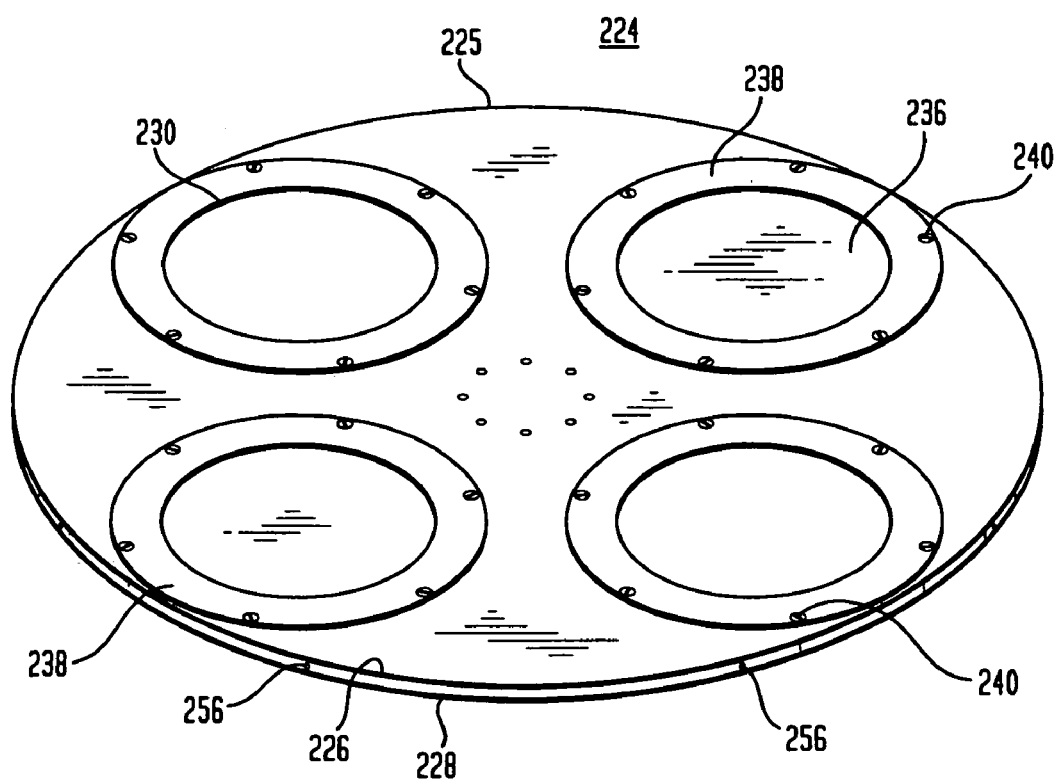
FIG. 4 shows a top perspective view of the wafer carrier of FIG. 3.
Figure 5:
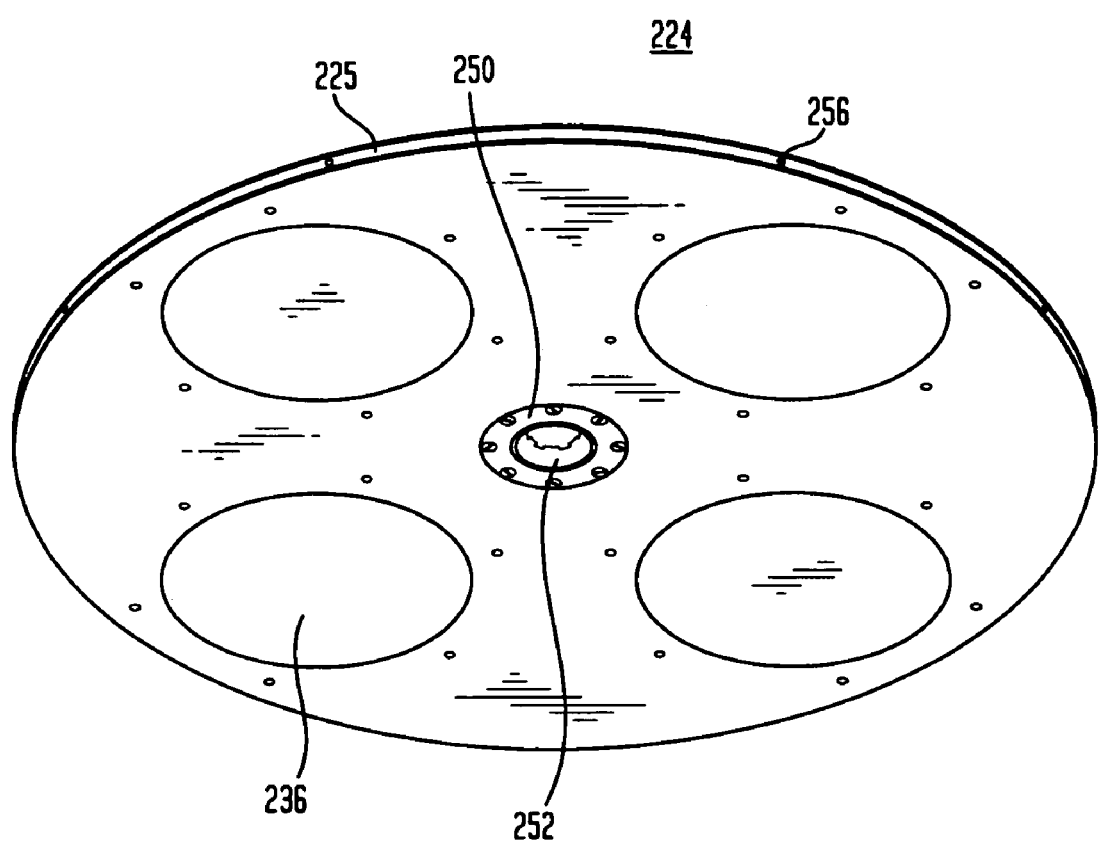
FIG. 5 shows a bottom perspective view of the wafer carrier of FIG. 3.

FIGS. 3–5 show a wafer carrier 224, in accordance with certain preferred embodiments of the present invention. The wafer carrier 224 is preferably made of any material that can withstand the temperature and chemical environment present inside a deposition chamber. In preferred embodiments, the wafer carrier 224 is made of materials such as molybdenum, tungsten, tantalum and rhenium. The wafer carrier includes a plate 225 having a top surface 226 and a bottom surface 228 remote therefrom. The plate 225 is milled to form a series of openings 230 extending completely through the plate. In the particular preferred embodiment shown in FIGS. 3–5, the plate 225 has four equally spaced openings 230 extending therethrough. Each opening includes a bottom annular flange 232 adjacent the bottom surface 228 of the plate 225 and a top annular flange 234 adjacent the top surface 226 of the plate. The radius of the top annular flange 234 is greater than the radius of the bottom annular flange 232. A disc of a substantially porous material is positioned in each one of the through openings 230. The disc of substantially porous material 236 may be made of materials such as silicon carbide and graphite. The bottom annular flange 232 defines a first well area for seating the porous disc 236. The top annular flange 234 defines a second well area for receiving a retaining ring 238 that is inserted into the second well for retaining the porous disc 236 in place. The retaining ring 238 may be made of any material that can withstand the temperature and chemical environment within a deposition chamber, such as molybdenum or tungsten. The retaining ring 238 is held in place by securing elements, such as screws 240.

The plate 225 also has radially extending hollow shafts 242 extending from the outer perimeter of the plate 224 towards a central opening 244 thereof. As will be described in more detail below, the radially extending hollow shafts 242 enable vacuum to be drawn therethrough. The hollow shafts 242 may be formed using a drill.

As noted above, the plate 225 includes the blind central opening 244 formed in the bottom surface 228 thereof. The blind central opening includes an annular flange 246 defining a bottom well 248 adapted to receive a separately machined piece 250. The machined piece 250 is secured in the central opening 244 using securing elements 252 such as screws. The machined piece 250 includes a central hub 252 made of non-diffusible material such as a ceramic material. In preferred embodiments, the central hub 252 is made of graphite. In other preferred embodiments, the central hub 252 is made of any material that will not diffuse into the spindle material so as to prevent the wafer carrier 224 from adhering to the spindle.

The hollow shafts 242 define openings at the outer perimeter of the plate 225. The openings 254 may be closed by a sealing element 256. The sealing element 256 may include any material that forms an airtight seal at the open ends 254 of the hollow shafts 242. In certain preferred embodiments, the sealing element 256 can be a securing element such as a screw threaded into the opening 254.

In operation, the central opening 244 of wafer carrier 224 is placed in alignment with an upper end of a spindle so that the central opening is in fluid communication with the opening at the upper end of the spindle. Wafer substrates are positioned over the porous discs 236 of the wafer carrier 224. Vacuum is drawn through the spindle (not shown) which, in turn, draws vacuum through the central opening 244, the hollow shafts 242 and the porous discs 236 inserted into the wafer carrier. As a result, as epitaxial layers are grown on the wafer substrates, the outer peripheral edges of the wafer substrates will be pulled by vacuum against the top surface of the porous disc 236. As described above, the vacuum through the porous disc 236 prevents the outer edges of the wafer substrate and the resulting wafer grown thereon from warping, which could change the operating properties of the curled regions of the wafer.

Providing an apparatus without an intervening object such as a susceptor between the wafer carrier and the heating filament also enhances heating efficiency. Although the present invention is not limited by any particular theory of operation, it is believed that providing an arrangement without an object such as a susceptor between the wafer carrier and the heating filament will enable the wafer growing process to occur with the heating filament at a much lower temperature. In prior art embodiments wherein an object such as a susceptor is positioned between the wafer carrier and the heating filament, in order to obtain a temperature of 1,150° C. at the top surface of the wafer carrier, the heating filament must be heated to approximately 2,500–2,600° C. This high temperature generally exceeds the maximum recommended temperature for the heating filament, which typically results in melting and deformation of the heating filament. In the present invention, which does not use an object such as a susceptor, the necessary 1,150° C. temperature for the wafer carrier may be reached by heating the heating filament to only 1,900–2,000° C. This is because the preferred embodiments of the present application provide direct heat transfer between the heating filament and the wafer carrier. Thus, the present invention provides direct heating of the wafer carrier 224 by heating filaments disposed within a reaction chamber. As used herein, the terminology "direct heating" means that no objects, such as a susceptor, are positioned between the wafer carrier and the heating filament. By having the filament directly heat the wafer carrier, the wafer carrier may be heated more efficiently and reach the relatively high temperatures needed for growing certain wafers without melting and/or deforming the heating filament which occurs with prior art devices.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus for growing wafers comprising:
a plate having a first surface and a second surface;
at least one opening extending from the first surface to the second surface of said plate;
a porous element disposed in the at least one opening in said plate, wherein said porous element is adapted to support one or more wafers;
a blind opening extending from the second surface toward the first surface of said plate;
at least one shaft extending between said blind opening and said porous element for providing fluid communication between said blind opening and said porous element, wherein suction is formed at a surface of said porous element by drawing vacuum through said blind opening and said at least one shaft; and a heating element opposing the second surface of said plate so that said porous element is directly exposed to said heating element for unobstructed, direct heating of said porous element.

2. The apparatus as claimed in claim 1, wherein said porous element is more porous than said plate.

3. The apparatus as claimed in claim 1, wherein said porous element is about 7–14% porous.

4. The apparatus as claimed in claim 1, wherein said wafer carrier comprises a material selected from the group consisting of molybdenum, tungsten, tantalum and rhenium.

5. The apparatus as claimed in claim 1, wherein said plate comprises a material selected from the group consisting of molybdenum, tungsten, tantalum and rhenium.

6. The apparatus as claimed in claim 1, wherein said porous element comprises a material selected from the group consisting of silicon carbide and graphite.

7. The apparatus as claimed in claim 1, wherein said blind opening is substantially centrally located on said plate and said at least one shaft extends outwardly from said blind opening.

8. The apparatus as claimed in claim 7, wherein said at least one shaft extends radially outwardly from said blind opening.

9. The apparatus as claimed in claim 1, wherein said at least one shaft is adapted for drawing vacuum therethrough for creating suction at a surface of said porous element.

10. The apparatus as claimed in claim 1, wherein said at least one opening comprises a plurality of openings, each said opening having one of said porous elements disposed therein.

11. The apparatus as claimed in claim 1, further comprising a hub disposed in said blind opening of said plate.

12. The apparatus as claimed in claim 11, wherein said hub is made of a non-diffusible material.

13. The apparatus as claimed in claim 11, wherein said hub is made of graphite or ceramic.

14. A An apparatus for growing wafers comprising:
a plate having a first surface and a second surface;
a plurality of openings extending from the first surface to the second surface of said plate;
a porous element disposed in each of said plate openings, wherein each said porous element is adapted to support one or more wafers;
a blind central opening extending from the second surface toward the first surface of said plate;
a plurality of shafts extending outwardly from said blind central opening, each said shaft having a first end in communication with said blind central opening and a second end in communication with one of said porous elements for providing fluid communication between said blind central opening and one of said porous elements, wherein suction is formed at a surface of each said porous element by drawing vacuum through said blind central opening and said shafts; said apparatus further comprising a heating element opposing the second surface of said plate so that said porous element is directly exposed to said heating element for unobstructed, direct heating of said porous element.

15. The apparatus as claimed in claim 14, wherein said plate openings have a first diameter at the first surface of said plate and a second diameter at the second surface of said plate, and wherein the first diameter is larger than the second diameter.

16. The apparatus as claimed in claim 15, further comprising retaining rings insertible into the first diameter openings in said plate for retaining said porous elements in place.

17. The apparatus as claimed in claim 16, wherein said retaining rings comprise materials selected from the group consisting of molybdenum and tungsten.

18. The apparatus as claimed in claim 14, wherein each said shaft extends around the perimeter of one of said porous elements.

19. An apparatus for growing epitaxial layers on wafers comprising:
a rotatable spindle having an upper end disposed inside a reaction chamber and an opening extending between the upper end and a lower end of said spindle;
a rotatable wafer carrier secured to the upper end of said spindle, said rotatable wafer carrier comprising
a plate having a first surface and a second surface,
at least one opening extending from the first surface to the second surface of said plate,
a porous element disposed in the at least one opening in said plate, wherein said porous element is adapted to support one or more wafers,
a blind opening extending from the second surface toward the first surface of said plate, said blind opening being in communication with the opening extending between the upper and lower ends of said spindle,
at least one shaft extending between said blind opening and said porous element for providing fluid communication between said blind opening and said porous element, wherein drawing vacuum through the opening of said spindle, said blind opening and said at least one shaft forms suction at a surface of said porous element, further comprising a heating element opposing the second surface of said plate so that said porous element is directly exposed to said heating element for unobstructed, direct heating of said porous element.

20. The apparatus as claimed in claim 19, wherein said porous element is more porous than said plate.

21. The apparatus as claimed in claim 19, wherein said at least one shaft extends around a perimeter of said porous element.

22. The apparatus as claimed in claim 19, wherein said porous element has a porosity of approximately 7–14%.

23. The apparatus as claimed in claim 19, wherein the lower end of said spindle is connected to a vacuum pump so that the pressure level at a surface of said porous element is less than the pressure level within said reaction chamber.

* * * * *